United States Patent [19]

Baldwin et al.

[11] 4,271,483

[45] Jun. 2, 1981

[54] DELAY CIRCUITS

[75] Inventors: John L. E. Baldwin, Croydon; Terence E. Corbyn, London, both of England

[73] Assignee: Independent Broadcasting Authority, London, England

[21] Appl. No.: 929,797

[22] Filed: Jul. 31, 1978

[30] Foreign Application Priority Data

Aug. 4, 1977 [GB] United Kingdom ............... 32769/77

[51] Int. Cl.³ .......................................... G06F 13/00
[52] U.S. Cl. .................................. 364/900; 370/108; 179/15.55 T
[58] Field of Search .................. 179/15.55 T, 15.55 R, 179/15.35; 364/900 MS File, 200 MS File; 333/138; 358/140

[56] References Cited

U.S. PATENT DOCUMENTS

| 3,500,330 | 3/1970 | Hertz | 364/900 |
| 3,934,094 | 1/1976 | Kobayashi et al. | 179/15.55 T |
| 4,121,058 | 10/1978 | Jusko et al. | 179/15.55 T |

*Primary Examiner*—Charles E. Atkinson
*Assistant Examiner*—E. S. Kemeny
*Attorney, Agent, or Firm*—Laubscher & Laubscher

[57] ABSTRACT

Digital delay apparatus for variable delay uses a shift register fixed delay driving a random access memory variable delay. A variable modulus counter controls the read-write addressing, whereby the difference between addresses sets the variable delay of the random access memory. The random access memory capacity is small relative to the shift register for increased efficiency.

2 Claims, 5 Drawing Figures

DELAY CIRCUITS

The present invention relates to digital circuits, and more particularly to delay circuits.

When processing digital signals, it is known to pass the signals through a shift register with the size of the shift register determining the delay. Such an arrangement is included in U.S. Pat. No. 4,051,531. By 'size' is meant the number of stages through which digital signals pass when going through the register. The difficulty with this arrangement is that manufacturers tend to make shift registers only in set sizes which normally differ in size by a factor of 2. Thus, if a delay of say 200 bits is required it would be necessary to use a combination of shift registers of differing sizes in order to provide such a delay, for example one 128-bit shift register, one 64-bit shift register and one 8-bit shift register. This can be expensive and also consume large amounts of space.

SUMMARY OF THE INVENTION

The present invention provides a random access memory device to provide at least part of a desired delay.

BRIEF DESCRIPTION OF THE DRAWING

Features and advantages of the present invention will be more apparent from the following description of embodiments thereof, given by way of example when taken in conjunction with the accompanying drawings, in which.

DETAILED DESCRIPTION

Figure 1:
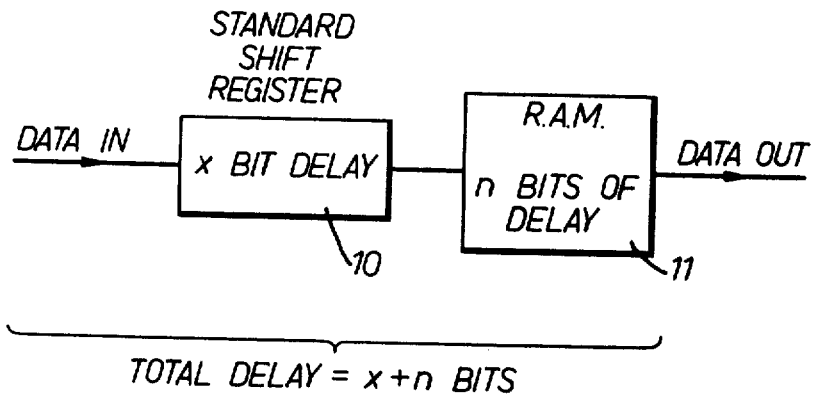
FIG. 1 shows a block diagram of the basic apparatus used in one embodiment of the present invention.

Referring to FIG. 1, the preferred embodiment of the present invention is based on a combination of a standard shift register 10 and a memory device 11. The register 10 provides part, and preferably the major part, of the desired delay with the remainder of the delay being provided by a random access memory device (RAM) 11. This arrangement provides a long delay using the minimum of apparatus. If only a short delay which is not a power of 2 is required, the RAM could be used alone.

Figure 2:
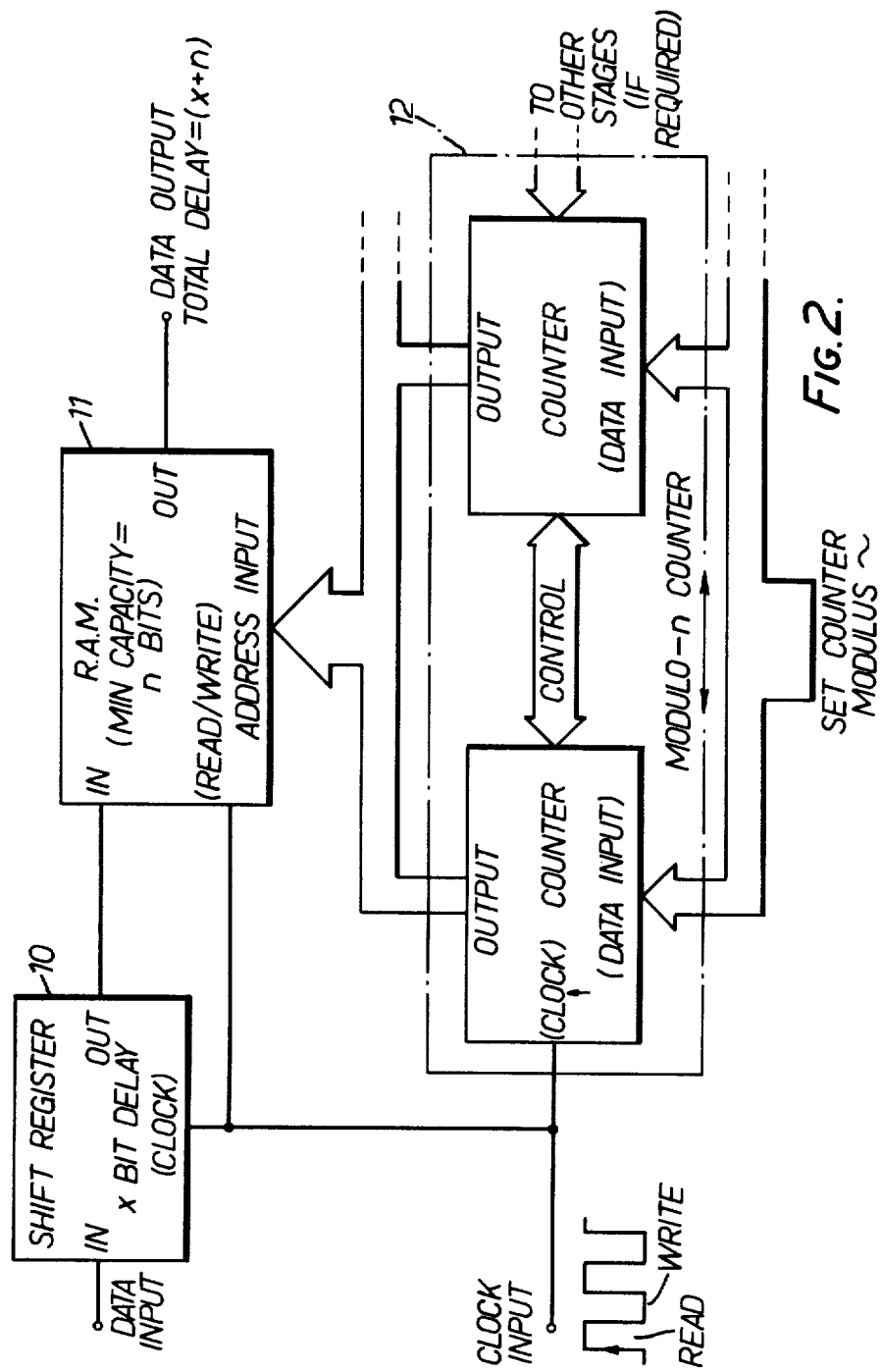
FIG. 2 shows a more detailed block diagram of the embodiment shown in FIG. 1.

FIG. 2 shows in block diagram form how the arrangement shown in FIG. 1 can be put into practice. A typical example of the use of the apparatus shown in FIG. 2 is when digitally recording a PAL television video signal by sampling the video signal at a multiple, e.g. twice subcarrier frequency ($2f_{sc}$). FIG. 2 will therefore be described in relation to such a use.

When digitally recording a PAL video signal by sampling at $2f_{sc}$ it is necessary to provide a one line delay, but there are 283.7516 cycles of PAL subcarrier per line. Hence for video sampled at $2F_{sc}$ there will be $2 \times 283.7516 = 567.5032$ samples per line. A one line delay would therefore be required for 567 or 568 bits. Using the apparatus shown in FIG. 2, this can be obtained by combining a commercially available 512 bit shift register 10 with the RAM 11, the RAM providing a delay of 55 or 56 bits.

The RAM 11 is a standard read/write RAM of a capacity of at least the desired delay, e.g. 56 bits the RAM being addressed by a variable counter 12 of modulus equal to the required delay for the RAM. The modulus of the counter 12 is set by applying a signal indicative of the required delay, e.g. 55 or 56, on the data input terminals of the counter. The counter 12 is shown as comprising two sections each capable of producing a 4-bit output. For a delay of 55 or 56 this is necessary but of course more of less sections may be required for different delays.

Figure 3:
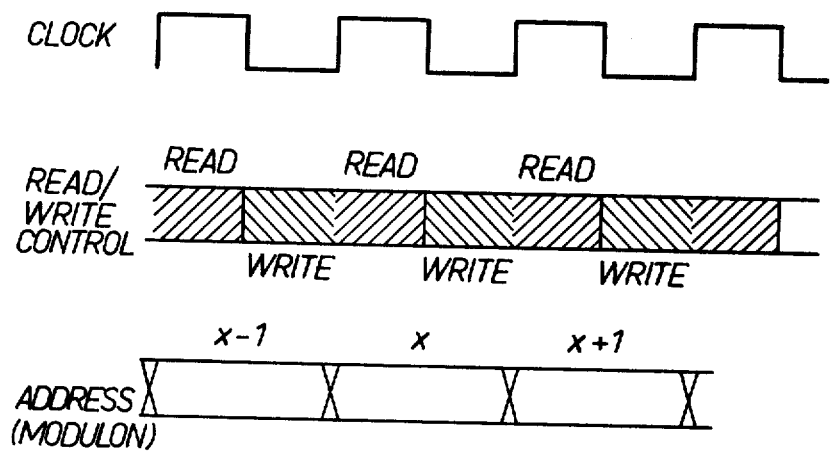
FIG. 3 shows diagrams which assist understanding of the block diagram of FIG. 2.

FIG. 3 shows the timing diagram for the RAM 11 giving n clock pulses delay by addressing the RAM using a modulo-n counter. During the time occupied by one clock period, the RAM is first put into the 'read' mode, and then the 'write' mode. Hence, information which was written n clock pulses before is obtained, and the new information is written, ready to be accessed n clock pulses later, giving the required delay.

For some applications, otherwise suitable shift registers and/or random access memories may be incapable of operating at the required speed. In this case m parallel paths operating at 1/m of the data rate may be used to overcome this problem. Using any one of the above embodiments, delay periods which were previously difficult or expensive to provide can now be easily obtained.

The additional delay can be accomplished in a number of ways depending on the type of RAM used and the way in which it is addressed. In FIG. 2, which shows diagrams which assist understanding of another form of apparatus which could be used as the apparatus shown in FIG. 1. A standard single port read/write RAM is used to provide the additional delay. Using this type of device, data is written into and read from the RAM in the space of one clock period.

Figure 4:
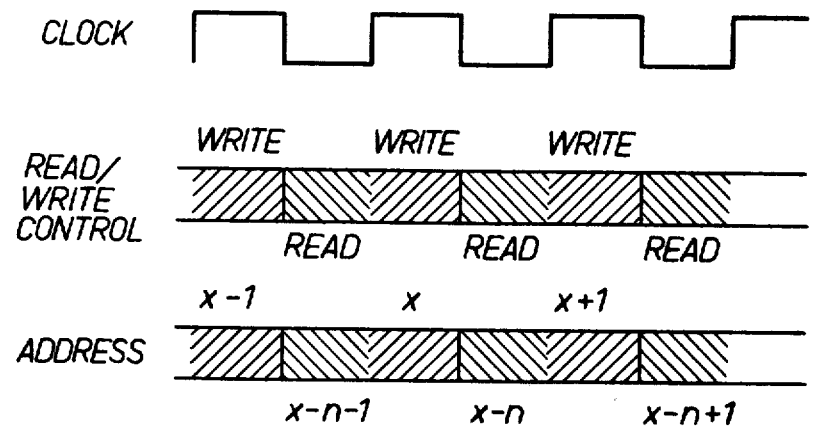
FIG. 4 shows diagrams which assist understanding of another embodiment of the present invention.

The write and read addresses are arranged to be separated by an interval of n by suitable external arithmetic of the correct modulus. Referring to FIG. 4, it can be seen that data is written into the RAM during the first half of the clock period at, for example address x. During the second half of the clock, data is read from the memory at address x-n. This then retrieves data which was written n clock pulses ago, and therefore gives the required delay. The delay may be varied simply by changing the value of n in the arithmetic which generates the read and write addresses.

Figure 5:
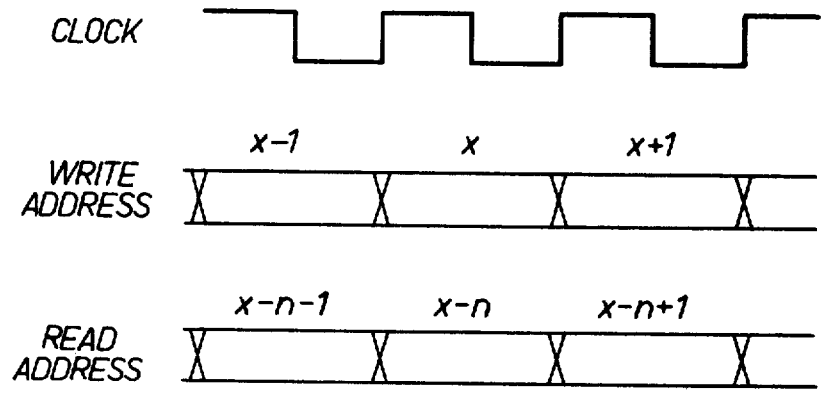
FIG. 5 shows diagrams which assist understanding of yet another embodiment of the present invention.

An alternative RAM which could be used is a two port RAM and FIG. 5 shows the relationship between read and write addresses to give n clock pulses of delay in a two port RAM. A two port RAM has the useful property that the memory cells are designed so that data may be written into and read from the memory at the same time. Two sets of addresses are required; a read address and a write address, and these addresses both increment on each clock pulse. By using a suitable counter system or arithmetic, it can be arranged that the read and write addresses are always a certain numerical value n apart. The difference between read and write addresses then gives the number of clock pulses delay through the RAM.

We claim:

1. Digital delay apparatus for delaying digital signals by a fixed time equivalent to x+n bits of information, comprising (a) a source of clock signals;
(b) shift register means (10) including a data input terminal adapted for connection with a digital signal source, a clock input terminal adapted for connection with said clock signal source for shifting said register means between signal receiving and signal transmitting modes, respectively, and an output terminal, said shift memory means having a given standard capacity (x);
(c) random access memory means (11) including a data input terminal connected with the output terminal of said shift register means, a read/write control input terminal connected with said source of clock signals, at least one address control input terminal, and a final output terminal, said random access memory means having a bit capacity that is small relative to that of said shift register means; and
(d) addressing means (12) including a variable modulus counter connected with said address control input terminal for controlling the address locations of information stored in said random access memory means, said variable modulus counter having a clock input terminal connected with said source of clock signals, and a data input terminal for setting the counter modulus to a desired delay value (n), said random access memory means and said addressing means being operable by said clock signals to cause the total delay of the output signal appearing at the output terminal of said memory means to equal the sum of the storage capacities of said shift register means and the set delay capacity of said random access memory means.

2. Apparatus as defined in claim 1, wherein said random access memory means is of the two address port type, the difference between read and write addresses affording the number of clock pulse delay through said memory means.

* * * * *